United States Patent
Cheng et al.

(10) Patent No.: US 10,770,563 B2
(45) Date of Patent: Sep. 8, 2020

(54) GATE STRUCTURE AND PATTERNING METHOD FOR MULTIPLE THRESHOLD VOLTAGES

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/363,109

(22) Filed: Mar. 25, 2019

(65) Prior Publication Data

US 2020/0135879 A1    Apr. 30, 2020

Related U.S. Application Data

(60) Provisional application No. 62/749,883, filed on Oct. 24, 2018.

(51) Int. Cl.
*H01L 29/49* (2006.01)
*H01L 27/092* (2006.01)
(Continued)

(52) U.S. Cl.
CPC .. *H01L 29/4966* (2013.01); *H01L 21/823821* (2013.01); *H01L 27/0886* (2013.01);
(Continued)

(58) Field of Classification Search
CPC ....................................................... H01L 29/51
See application file for complete search history.

(56) References Cited

U.S. PATENT DOCUMENTS 9,431,304 B2     8/2016  Huang et al.
9,502,416 B1 *  11/2016  Kim .................... H01L 27/1116
(Continued)

OTHER PUBLICATIONS

Tosatti, S. et al., "Self-Assembled Monolayers of Dodecyl and Hydroxy-dodecyl Phosphates on Both Smooth and Rough Titanium and Titanium Oxide Surfaces", Langmuir, vol. 18, Apr. 5, 2002, pp. 3537-3548.

*Primary Examiner* — Caridad Everhart
*Assistant Examiner* — Ankush K Singal
(74) *Attorney, Agent, or Firm* — Haynes and Boone, LLP

(57) ABSTRACT

A semiconductor device and a method of forming the same are provided. In one embodiment, the semiconductor device includes a semiconductor substrate, a plurality of channel regions including first, second, and third p-type channel regions as well as first, second, and third n-type channel regions, and a plurality of gate structures. The plurality of gate structures includes an interfacial layer (IL) disposed over the plurality of channel regions, a first high-k (HK) dielectric layer disposed over the first p-type channel region and the first n-type channel region, a second high-k dielectric layer disposed over the first n-type channel region, the second n-type channel region, the first p-type channel region, and the second p-type channel region; and a third high-k dielectric layer disposed over the plurality of channel regions. The first, second and third high-k dielectric layers are different from one another.

20 Claims, 15 Drawing Sheets

(51) Int. Cl.
   *H01L 29/66* (2006.01)
   *H01L 27/088* (2006.01)
   *H01L 29/78* (2006.01)
   *H01L 21/8238* (2006.01)

(52) U.S. Cl.
   CPC .... *H01L 27/0924* (2013.01); *H01L 29/66545* (2013.01); *H01L 29/7853* (2013.01)

(56) References Cited

U.S. PATENT DOCUMENTS

| | | |
|---|---|---|
| 9,799,745 B2 | 10/2017 | Lee et al. |
| 10,049,940 B1 | 8/2018 | Chen et al. |
| 2007/0134922 A1 | 6/2007 | Mori et al. |
| 2009/0267132 A1 | 10/2009 | Cha et al. |
| 2013/0214336 A1 | 8/2013 | Hsu et al. |
| 2016/0315164 A1 | 10/2016 | Son et al. |
| 2016/0372565 A1 | 12/2016 | Huang et al. |
| 2017/0110324 A1 | 4/2017 | Tsai et al. |
| 2017/0110552 A1 | 4/2017 | Lee et al. |
| 2018/0226300 A1* | 8/2018 | Song .................. H01L 29/517 |
| 2019/0139954 A1* | 5/2019 | Cheng ............... H01L 21/32136 |
| 2020/0043927 A1* | 2/2020 | Wang ............... H01L 29/66545 |

* cited by examiner

US 10,770,563 B2

GATE STRUCTURE AND PATTERNING METHOD FOR MULTIPLE THRESHOLD VOLTAGES

PRIORITY

This application claims the benefits of U.S. provisional application Ser. No. 62/749,883, filed Oct. 24, 2018, the entire disclosure of which is herein incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, gate replacement processes, which typically involve replacing polysilicon gate electrodes with metal gate electrodes, have been implemented to improve device performance, where work function values of the metal gate electrodes are designed to provide different fin-type field effect transistors (FinFETs) with different threshold voltages. Although existing FinFETs providing multiple threshold voltages have been generally adequate for their intended purposes, they have not been entirely satisfactory in all respects as IC technology nodes shrink.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
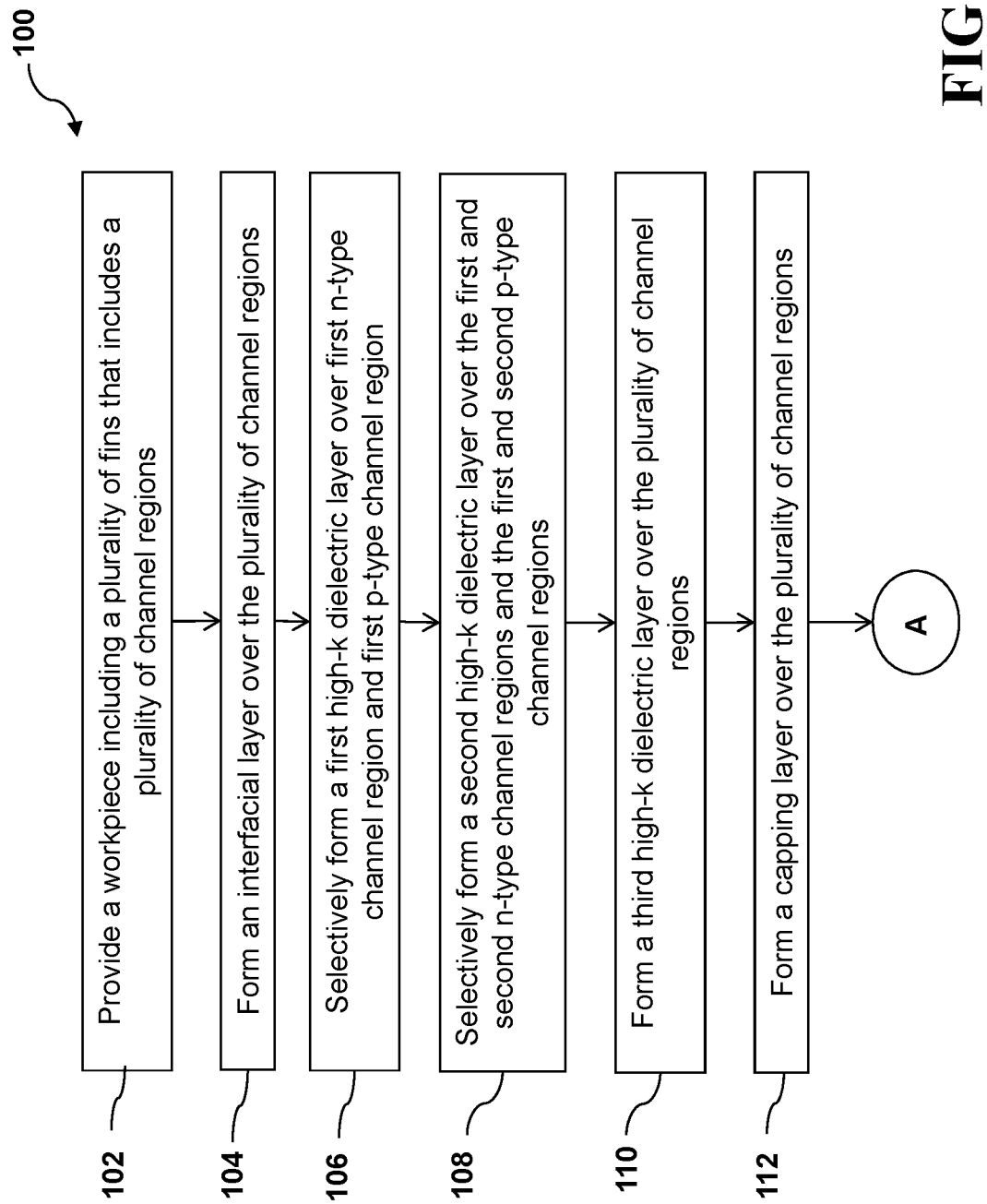
FIGS. 1A and 1B show a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to gate structures and patterning methods thereof for realizing multiple threshold voltages.

During fabrication of a FinFET device, a gate replacement process may be implemented to reduce thermal budget associated with the fabrication steps. For example, during a "gate-last" process, a dummy gate structure is first formed over a substrate as a placeholder before forming other components, e.g., source/drain features. Once the other components have been formed, the dummy gate structure is removed, and a metal gate structure is formed in its place. Multiple patterning processes may be implemented to form various material layers within the metal gate structure to provide certain device capabilities such as multiple threshold voltages. Multi-threshold voltage (Vt) devices enable flexible and diverse applications of FinFETs.

Multiple threshold voltages of the FinFET device can be accomplished by stacking multiple work function metal (WFM) layers in the metal gate structure. For example, for advanced technology one way to accomplish multiple Vt of n-type or p-type MOSFET is to increase different thicknesses of n/p work function metals by photo patterning and use ion implantation. Below N5 generation, the gate fill window and conformity requirement become more and more challenging.

In the present disclosure, the deposition and patterning of multiple high-k dielectric layers is used for multiple Vt tuning. Although not intended to be limiting, one or more embodiments of the present disclosure provide many benefits to a semiconductor device and the formation thereof.

Because the high-k dielectric layers are formed before the work function metal layers and when the opening of gate trenches is relatively wide, the patterning of the high-k dielectric layers has greater process tolerance and process window. As a result, the yield for fabricating FinFET devices with multiple threshold voltage and gap-fill capability is improved on smaller FinFET devices are improved. The adoption of the method disclosed in the present disclosure may also simplify the fabrication processes and reduce production cost. The techniques disclosed in the present disclosure may replace or supplement other Vt tuning techniques, such as those that include patterning of multiple work function metal layers.

Figure 1B:
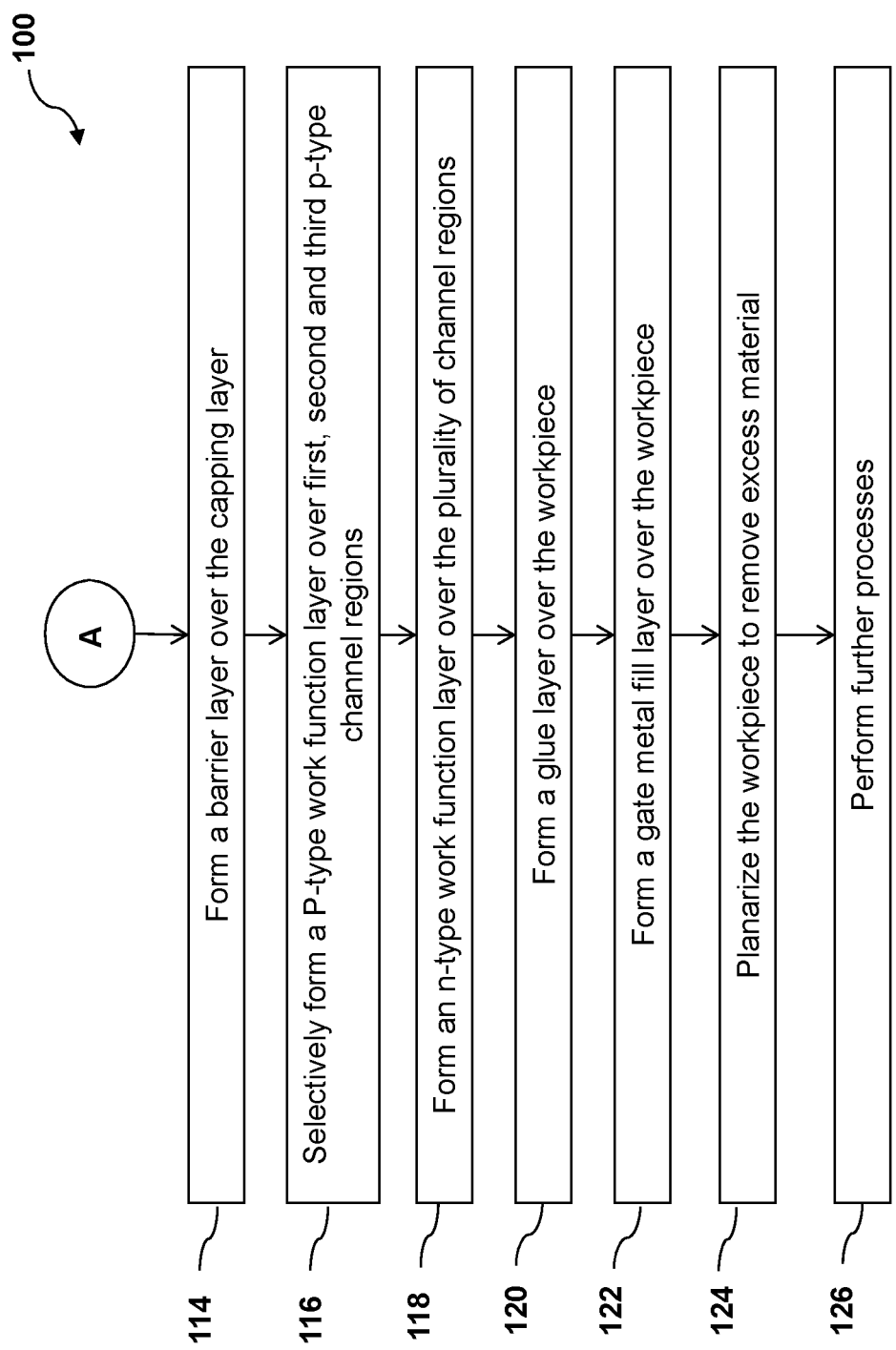

Referring to FIGS. 1A and 1B, shown therein is a flowchart illustrating a method 100 for fabricating a semiconductor device, according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-15 that illustrate a workpiece 200 at various fabrication stages. The workpiece 200 may include an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
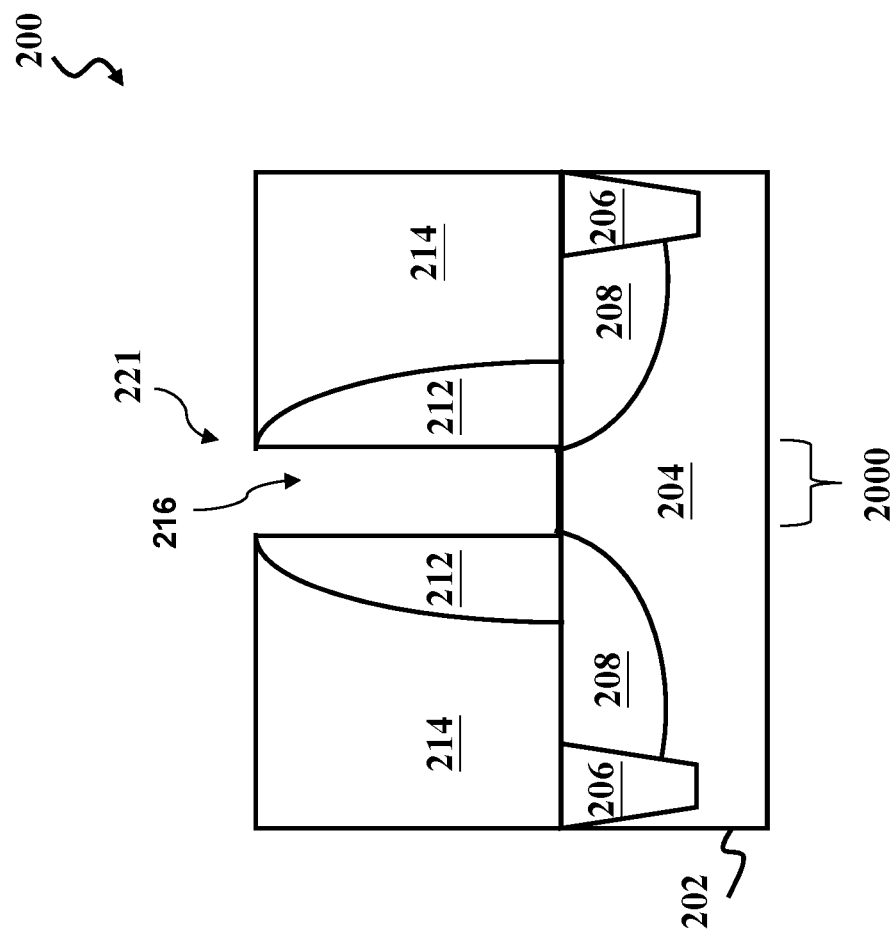
FIG. 2 illustrates cross-sectional views of n-type and p-type semiconductor devices on a workpiece, according to some embodiments of the present disclosure.
Figure 3:
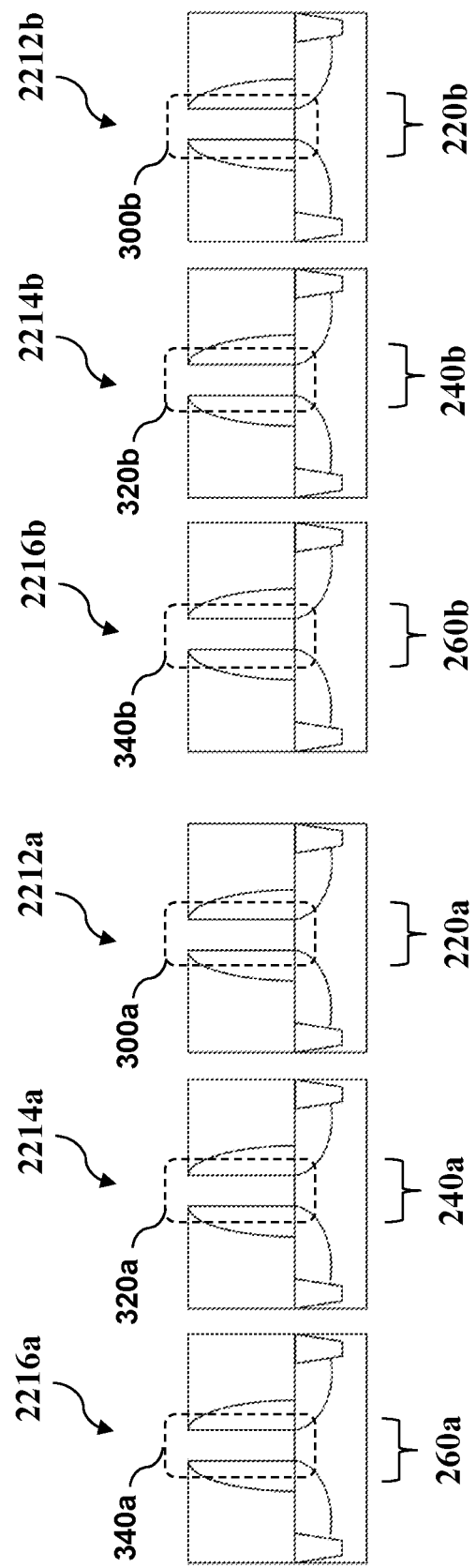
FIG. 3 illustrates cross-sectional views of a first, a second and a third n-type semiconductor devices and a first, a second and a third p-type semiconductor devices on a workpiece, according to some embodiments of the present disclosure.

Referring now to FIGS. 1A, 2 and 3, the method 100 of the present disclosure includes a block 102 where a workpiece 200 is provided. In some embodiments, the workpiece 200 may include a plurality of fins that includes a plurality of channel regions.

Reference is now made to FIG. 2, which illustrate a single representative semiconductor device 221 fabricated on the workpiece 200. The workpiece 200 may include a substrate 202 and isolation structures 206 over the substrate 202. The substrate 202 is a silicon substrate in the present embodiment. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) such as having a buried dielectric layer.

The isolation structures 206 separate the workpiece 200 into various device regions, which may or may not be contiguous. The isolation structures 206 may include silicon oxide, silicon nitride, silicon oxynitride, fluoride-doped silicate glass (FSG), a low-k dielectric material, and/or other suitable insulating material. The isolation structures 206 may be shallow trench isolation (STI) features. In an embodiment, the isolation structures 206 are formed by etching isolation trenches in the substrate 202, e.g., as part of the fins 204 formation process. The isolation trenches may then be filled with isolating material, followed by a chemical mechanical planarization (CMP) process and/or an etch-back process. Other isolation structure such as field oxide, LOCal Oxidation of Silicon (LOCOS), and/or other suitable structures are possible. The isolation structure 206 may include a multi-layer structure, for example, having one or more thermal oxide liner layers.

In the present embodiment, the workpiece 200 includes a plurality of fins 204 that projects from the substrate 202 upwardly through the isolation structures 206. In the present embodiment, the fin 204 can be made suitable for forming n-type FinFET(s) or p-type FinFET(s). The fins 204 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204 by etching initial epitaxial semiconductor layers of the substrate 202. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Each of the device regions may include multiple fins. Each of the multiple fins may be processed to have more than one semiconductor device, such as the semiconductor device 221. The present disclosure is not limited to any particular number of devices or device regions, or to any particular device configurations. Further, even though FinFETs are used as examples, the workpiece 200 may alternatively or additionally include 2-D transistors (or planar transistors). Further still, in some embodiments, the workpiece 200 may include gate-all-around (GAA) transistors.

The representative semiconductor device 221 includes a gate trench 216, which is formed after a dummy gate stack (or placeholder gate stack/structure, or temporary gate stack/structure) is removed. The dummy gate stacks engage the fins 204 on two or three sides of the fins in the present embodiment. The dummy gate stack may include one or more material layers, such as an oxide layer, a polysilicon layer, a hard mask layer, and other suitable layers. The various layers in the dummy gate stacks may be formed by suitable deposition techniques. For example, the oxide layer may be formed by chemical oxidation, thermal oxidation, ALD, CVD, and/or other suitable methods. For example, the polysilicon layer may be formed by suitable deposition processes such as low-pressure chemical vapor deposition (LPCVD) and plasma-enhanced CVD (PECVD). In an embodiment, the dummy gate stacks are first deposited as blanket layers. Then the blanket layers are patterned through a process including photolithography processes and etching processes thereby removing portions of the blanket layers and keeping the remaining portions over the isolation structure 206 and the fins 204 as the dummy gate stacks.

The gate trench 216 is defined by gate spacers 212, which are formed on sidewalls of the dummy gate structure. The gate spacers 212 may include one or more gate spacer layers and may be formed of semiconductor oxide and/or semiconductor nitride that is doped with dopants such as carbon, oxygen or nitrogen. The gate trench 216 is to be filed with a high-k metal gate structure. As described above, the formation of the dummy gate structure and the replacement of the dummy gate structure with a function or high-k metal gate structure may be referred to as a gate replacement process.

In a channel region 2000 of the fin 204, the gate trench 216 exposes sidewalls and a top surface of the fins 204. The channel region 2000 is sandwiched between source/drain (S/D) regions (or S/D features) 208 at least partially embedded in the respective fins 204. The S/D features 208 may extend above the isolation structures 206 in some embodiments. The S/D features 208 may be formed by various techniques, such as etching processes followed by one or more epitaxy processes. In one example, one or more etching processes are performed to remove portions of the fins 204 to form recesses therein. A cleaning process may be performed that cleans the recesses with a hydrofluoric acid (HF) solution or other suitable solution. Subsequently, one or more epitaxial growth processes are performed to grow semiconductor features (e.g., silicon for NFET and silicon-germanium for PFET) in the recesses. The epitaxial growth process may in-situ or ex-situ dope the grown semiconductor with a p-type dopant for forming a p-type FinFET or an n-type dopant for forming an n-type FinFET.

The workpiece 200 further includes an inter-layer dielectric (ILD) layer 214 surrounding the gate trench 216, including the gate spacers 212. The ILD layer 214 is formed over the substrate 202. In embodiments, the representative semiconductor device 221 further includes a contact etch stop layer (e.g., a silicon nitride layer) underneath the ILD layer 214. The ILD layer 214 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 214 may be deposited by a PECVD process or a flowable CVD (FCVD) process. After various deposition processes, a chemical mechanical planarization (CMP) process is performed to planarize a top surface of the ILD layer 214 and to expose a top surface of the dummy gate stacks for subsequent fabrication steps.

As illustrated in FIG. 3, the workpiece 200 includes a plurality of channel regions over the plurality of fins 204. For example, the workpiece 200 may include a first n-type device 2212a, a second n-type device 2214a, a third n-type device 2216a, a first p-type device 2212b, a second p-type device 2214b, and a third p-type device 2216b. In some embodiments, the first n-type device 2212a includes a gate trench 300a exposing a first n-type channel region 220a; the second n-type device 2214a includes a gate trench 320a exposing a second n-type channel region 240a; the third n-type device 2216a includes a gate trench 340a exposing a third n-type channel region 260a; the first p-type device 2212b includes a gate trench 300b exposing a first p-type channel region 220b; the second p-type device 2214b includes a gate trench 320b exposing a second p-type channel region 240b; and the third p-type device 2216b includes a gate trench 340b exposing a third p-type channel region 260b. For ease of illustration, an embodiment of the formation of high-k metal gate structures in the gate trenches 300a, 320a, 340a, 300b, 320b, and 340b is illustrated in FIGS. 4-15.

Figure 4:
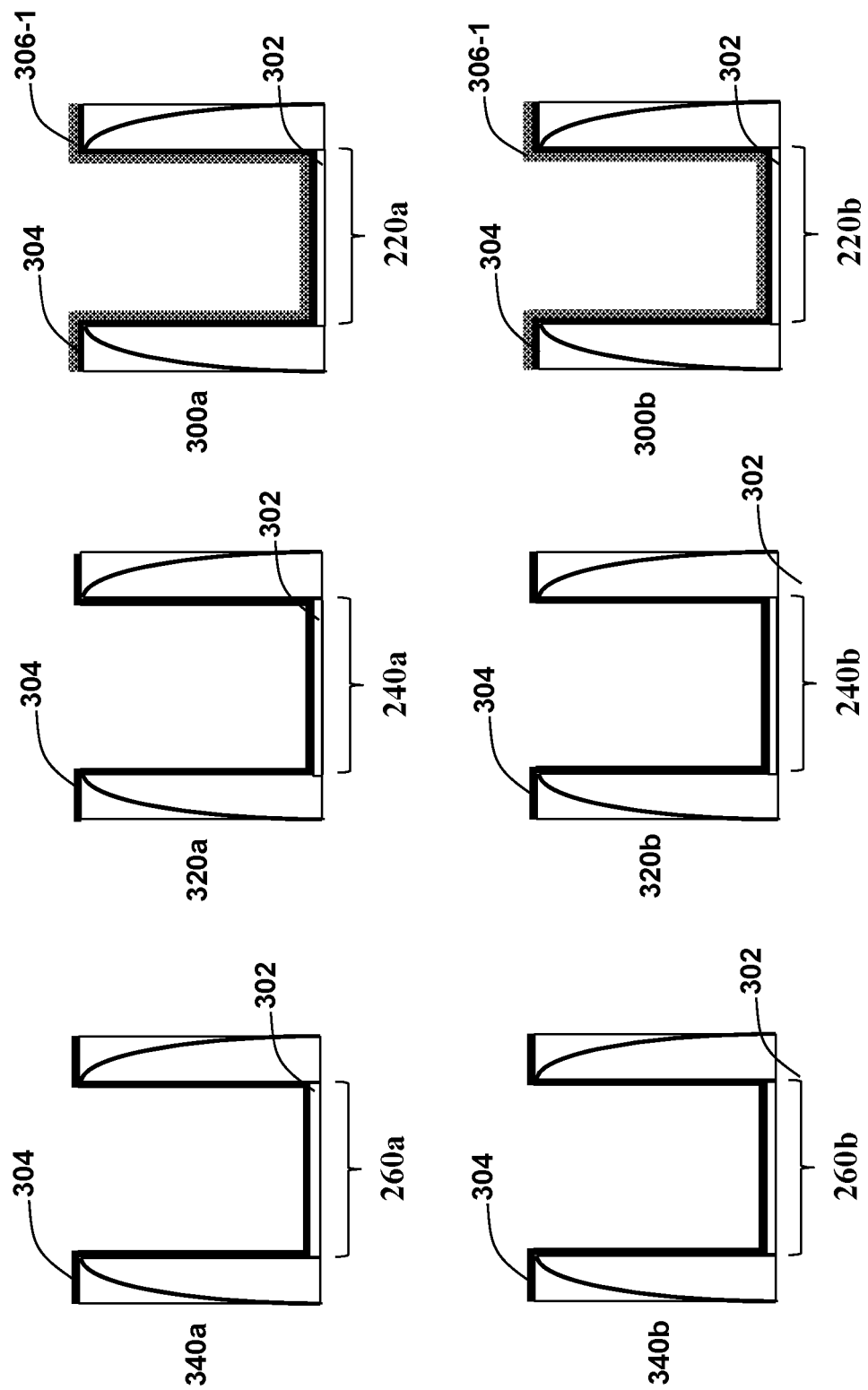
FIGS. 4-14 are cross-sectional views of various channel regions on the workpiece in FIG. 3 at various fabrication stages of a method for forming a semiconductor device, such as the method in FIGS. 1A and 1B, in accordance with some embodiments of the present disclosure.

Referring to FIGS. 1A and 4, the method 100 includes a block 104 where an interfacial layer 302 is formed over the plurality of channel regions over the plurality of fins 204, such as the first n-type channel region 220a, the second n-type channel region 240a, the third n-type channel region 260a, the first p-type channel region 220b, the second p-type channel region 240b, and the third p-type channel region 260b. In some implementations, the interfacial layer 302 may include $SiO_2$, SiON, or other suitable dielectric materials and may be formed by chemical oxidation, thermal oxidation, ALD, and/or other suitable methods. In one embodiment, the fin 204 consists essentially of silicon and the interfacial layer 302 consists essentially of silicon oxide. In this embodiment, the interfacial layer 302 is formed using chemical oxidation where the plurality of channel regions is exposed to an oxidizer or oxidizer-containing rinse liquid that oxides the channel regions of the fins 204 to form the interfacial layer 302. When chemical oxidation is used to form the interfacial layer 302, the interfacial layer 302 is only substantially formed over the channel regions of the fins 204 while the sidewalls of the gate spacers 212 are substantially free of the interfacial layer 302.

Figure 5:
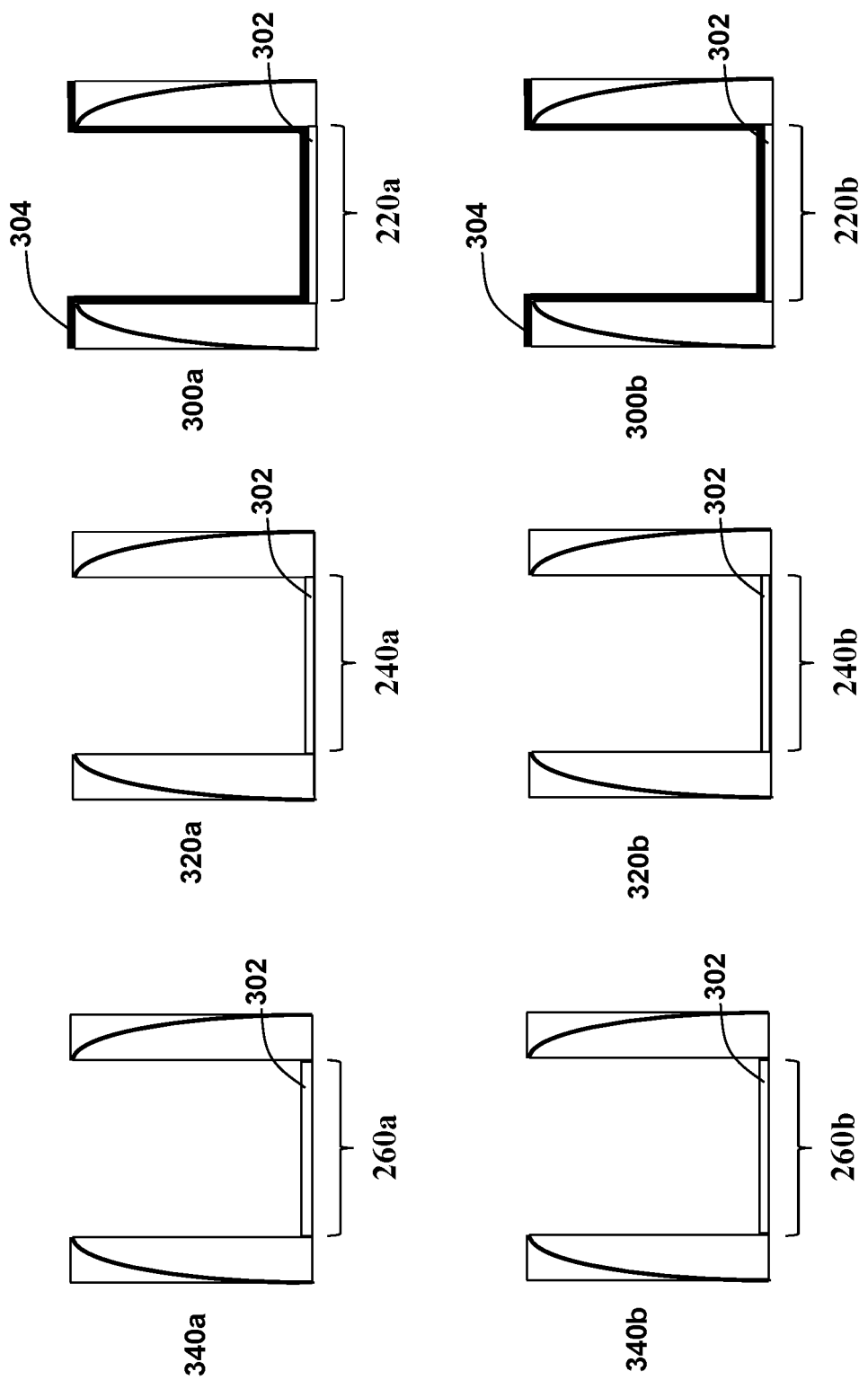

Referring to FIGS. 1A, 4 and 5, the method 100 include a block 106 where first high-k dielectric layer 304 is selectively formed over the first n-type channel region 220a and the first p-type channel region 220b. In some embodiments as illustrated in FIG. 4, the first high-k dielectric layer 304 is globally deposited over the workpiece 200, including over the plurality of channel regions, such as the first n-type channel region 220a, the second n-type channel region 240a, the third n-type channel region 260a, the first p-type channel region 220b, the second p-type channel region 240b, and the third p-type channel region 260b. In some instances, after the first high-k dielectric layer 304 is globally deposited, a first hard mask layer 306-1 is globally deposited over the first high-k dielectric layer 304. The first hard mask layer 306-1 is formed of a material that allows its selective removal without damaging the first high-k dielectric layer 304. In some embodiments, the first hard mask layer 306-1 is formed of a nitride, such as titanium nitride, tantalum nitride, or other suitable metal nitride. In some instances, the first hard mask layer 306-1 is formed of titanium nitride using ALD to a thickness between about 10 Å and about 25 Å. In those instances, the ALD formation of the first hard mask layer 306-1 includes about 20 to about 50 cycles at a temperature between about 400° C. and about 450° C. As shown in FIG. 4, the first hard mask layer 306-1 is then patterned using photolithography techniques such that the first hard mask layer 306-1 only covers the first n-type channel region 220a and the first p-type channel region 220b. As illustrated in FIG. 5, the patterned first hard mask layer 306-1 is then used as an etch mask to selectively remove the first high-k dielectric layer 304 over the second n-type channel region 240a, the third n-type channel region 260b, the second p-type channel region 240b, and the third p-type channel region 260b. The patterned first hard mask layer 306-1 is then removed by selectively etching, as shown in FIG. 5.

In some embodiments, the first high-k dielectric layer 304 may be deposited using atomic layer deposition (ALD) or other suitable method. In one embodiment, the first high-k dielectric layer 304 is deposited using ALD for about 10 to about 20 cycles at a temperature between about 200° C. and about 300° C. to form the first high-k dielectric layer 304 to a thickness between about 5 Å and about 10 Å. In some implementations, the first high-k dielectric layer 304 may be formed of a high-k dielectric material such as HfO2, Al2O3, TiO2, La2O3, HfSiO4, ZrO2, Y2O3, SrTiO3, combinations thereof, or other suitable material. In these implementations, the first high-k dielectric layer 304 may be doped with a p-type work function dopant, such as aluminum. In an example, the first high-k dielectric layer 304 may be formed using ALD with hafnium chloride (HfCl$_4$) and water (H$_2$O) as precursors at a temperature between about 200° C. and about 300° C., and is doped with aluminum with TMA (trimethyl aluminum) as the aluminum source.

Figure 6:
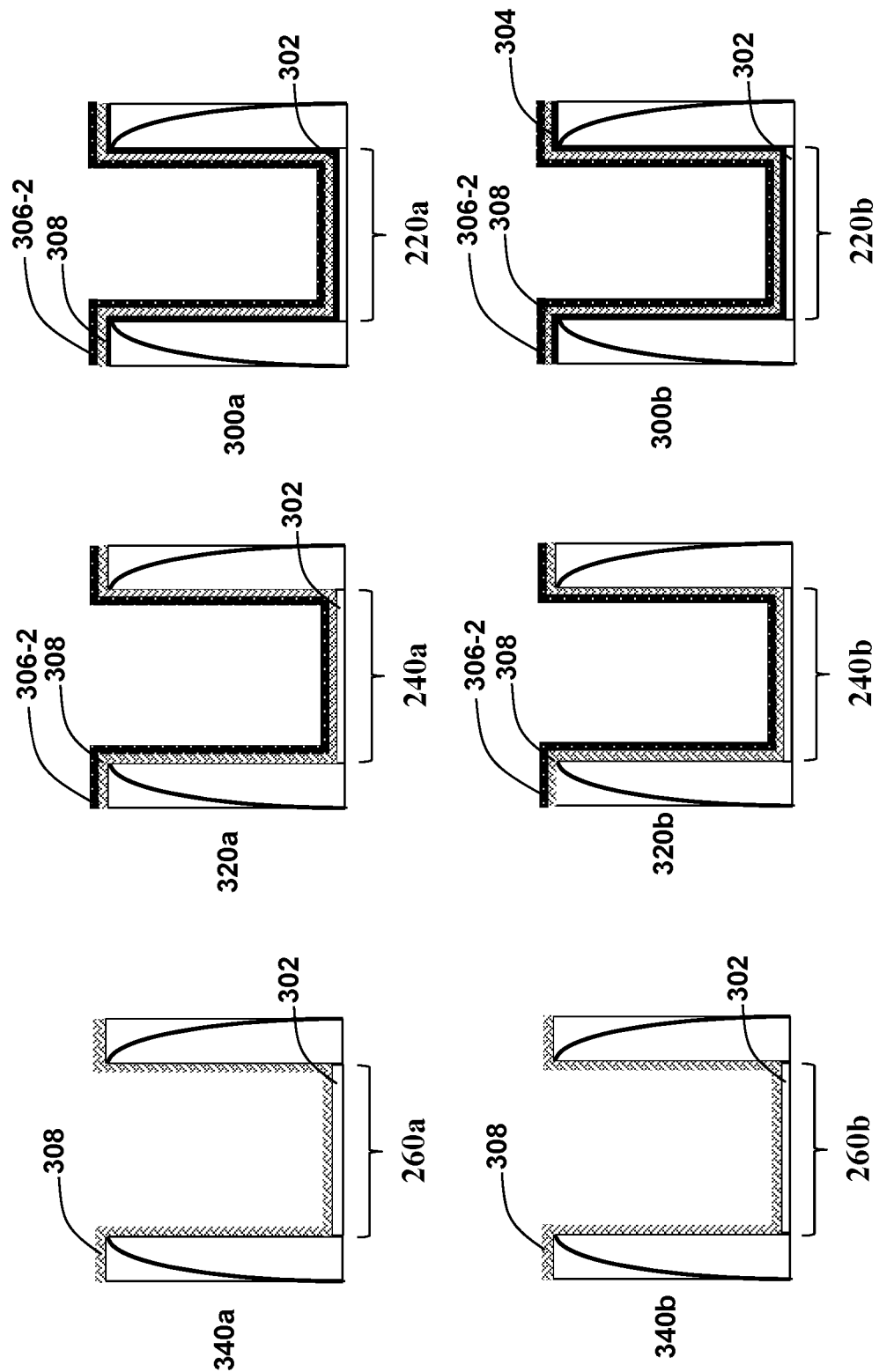
Figure 7:
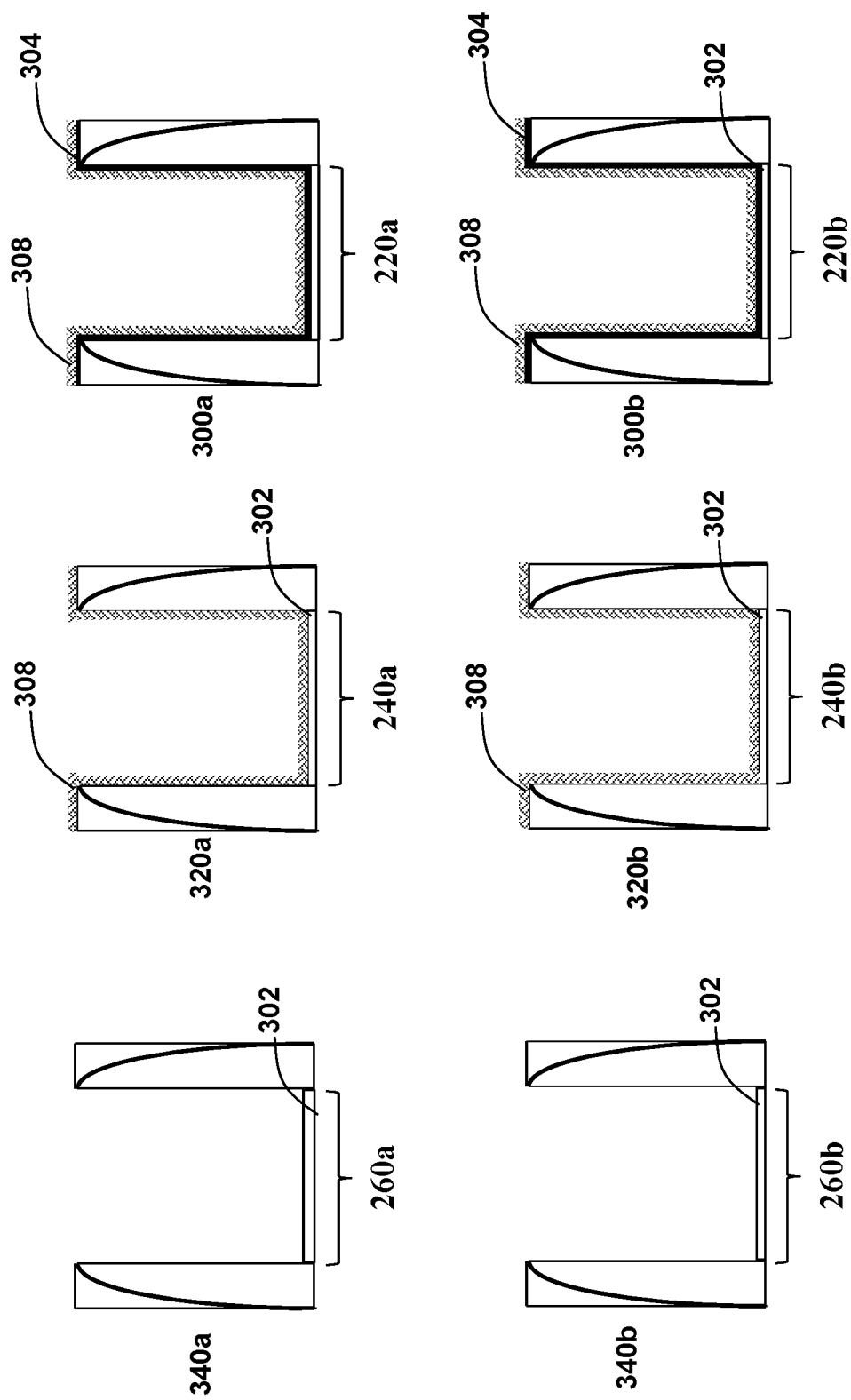

Referring to FIGS. 1A, 6 and 7, the method 100 include a block 108 where a second high-k dielectric layer 308 is selectively formed over the first n-type channel region 220a, first p-type channel region 220b, second n-type channel region 240a, and second p-type channel region 240b. In some embodiments as illustrated in FIG. 6, the second high-k dielectric layer 308 is globally deposited over the workpiece 200, including over the plurality of channel regions, such as the first n-type channel region 220a, the second n-type channel region 240a, the third n-type channel region 260a, the first p-type channel region 220b, the second p-type channel region 240b, and the third p-type channel region 260b. In some instances, the second high-k dielectric layer 308 is deposited directly on the first high-k dielectric layer 304 over the first n-type channel region 220a and the first p-type channel region 220b. In some instances, after the second high-k dielectric layer 308 is globally deposited, a second hard mask layer 306-2 is globally deposited over the second high-k dielectric layer 308. In some embodiments, the second hard mask layer 306-2 may share the same composition with the first hard mask layer 306-1. The second hard mask layer 306-2 is formed of a material that allows its selective removal without damaging the second high-k dielectric layer 308. In some embodiments, the second hard mask layer 306-2 is formed of a nitride, such as titanium nitride, tantalum nitride, or other suitable metal nitride. As illustrated in FIG. 6, the second hard mask layer 306-2 is then patterned using photolithography techniques such that the second hard mask layer 306-2 only covers the first n-type channel region 220a, the first p-type channel region 220b, the second n-type channel region 240a, and the second p-type channel region 240b. Then, as shown in FIG. 7, the patterned second hard mask layer 306-2 is then used as an etch mask to selectively remove the second high-k dielectric layer 308 over the third n-type channel region 260a and the third p-type channel region 260b. Thereafter, the patterned second hard mask layer 306-2 is removed by selective etching, as depicted in FIG. 7.

In some embodiments, the second high-k dielectric layer 308 may be deposited using atomic layer deposition (ALD) or other suitable method. In one embodiment, the second high-k dielectric layer 308 is deposited using ALD for about 20 to about 30 cycles at a temperature between about 200° C. and about 300° C. to form the second high-k dielectric layer 308 to a thickness between about 10 Å and about 15 Å. In some implementations, the second high-k dielectric layer 308 may be formed of a high-k dielectric material such as HfO2, Al2O3, TiO2, La2O3, HfSiO4, ZrO2, Y2O3, SrTiO3, combinations thereof, or other suitable material. In an example, the second high-k dielectric layer 308 may be formed using ALD with hafnium chloride (HfCl$_4$) and water (H$_2$O) as precursor at a temperature between about 200° C. and about 300° C. In some instances, the second high-k dielectric layer 308 is not doped.

Figure 8:
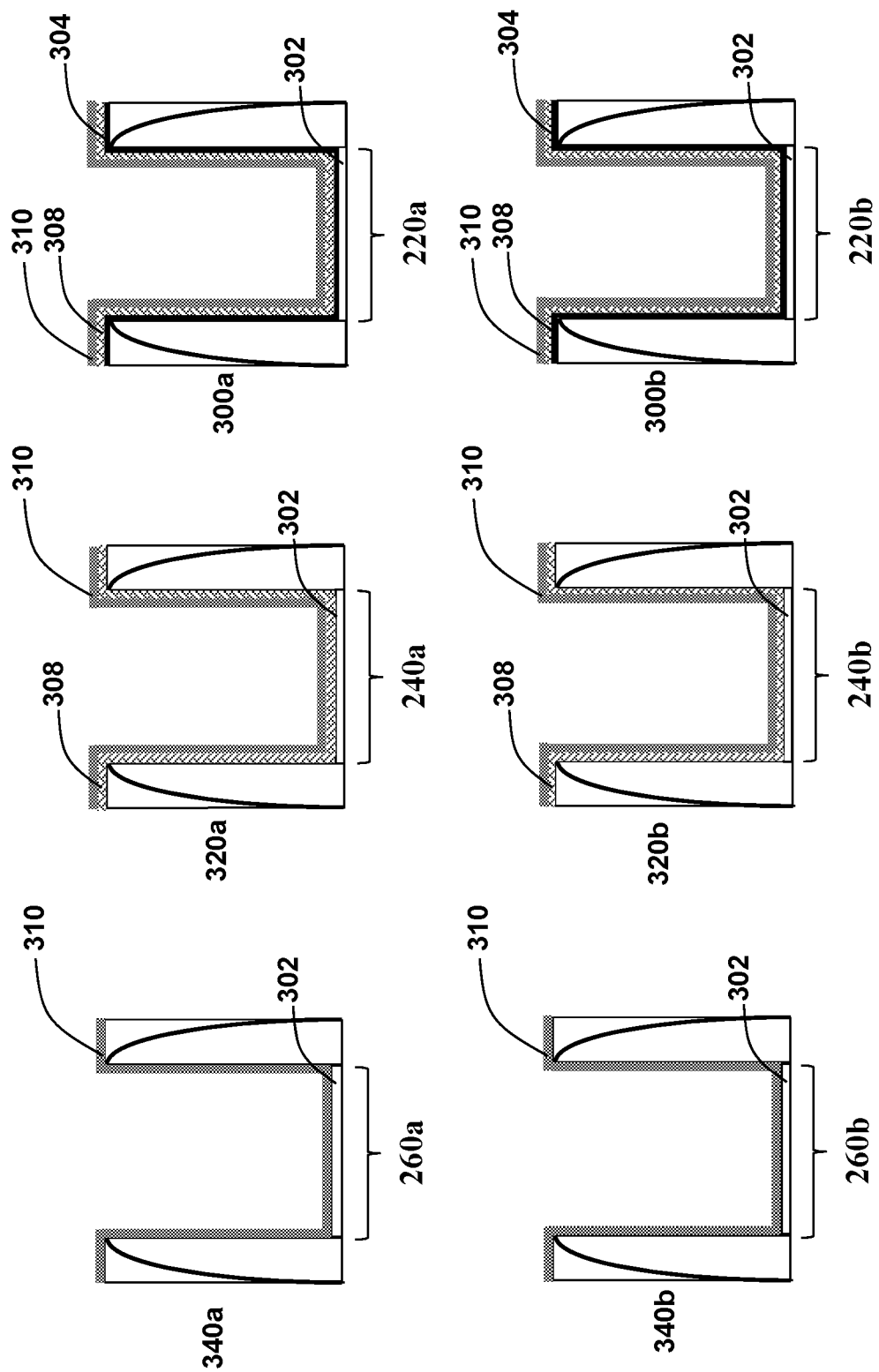

Referring to FIGS. 1A and 8, the method 100 includes a block 110 where a third high-k dielectric layer 310 is formed over the plurality of channel regions, including the first n-type channel region 220a, the second n-type channel region 240a, the third n-type channel region 260a, the first p-type channel region 220b, the second p-type channel region 240b, and the third p-type channel region 260b. In some instances, the third high-k dielectric layer 310 is deposited directly on the second high-k dielectric layer 308 over the first n-type channel region 220a, the second n-type channel region 240a, the first p-type channel region 220b, and the second p-type channel region 240b.

In some embodiments, the third high-k dielectric layer 310 may be deposited using atomic layer deposition (ALD) or other suitable method. In one embodiment, the third high-k dielectric layer 310 is deposited using ALD for about 30 to about 40 cycles at a temperature between about 200° C. and about 300° C. to form the third high-k dielectric layer 310 to a thickness between about 15 Å and about 20 Å. In some implementations, the third high-k dielectric layer 310 may be formed of a high-k dielectric material such as HfO2, Al2O3, TiO2, La2O3, HfSiO4, ZrO2, Y2O3, SrTiO3, combinations thereof, or other suitable material. In these implementations, the third high-k dielectric layer 310 may be doped with an n-type work function dopant, such as lanthanum. In an example, the third high-k dielectric layer 310 may be formed using ALD with hafnium chloride (HfCl$_4$) and water (H$_2$O) as precursor and is doped with lanthanum with lanthanum chloride (LaCl$_3$) as the lanthanum source.

Figure 9:
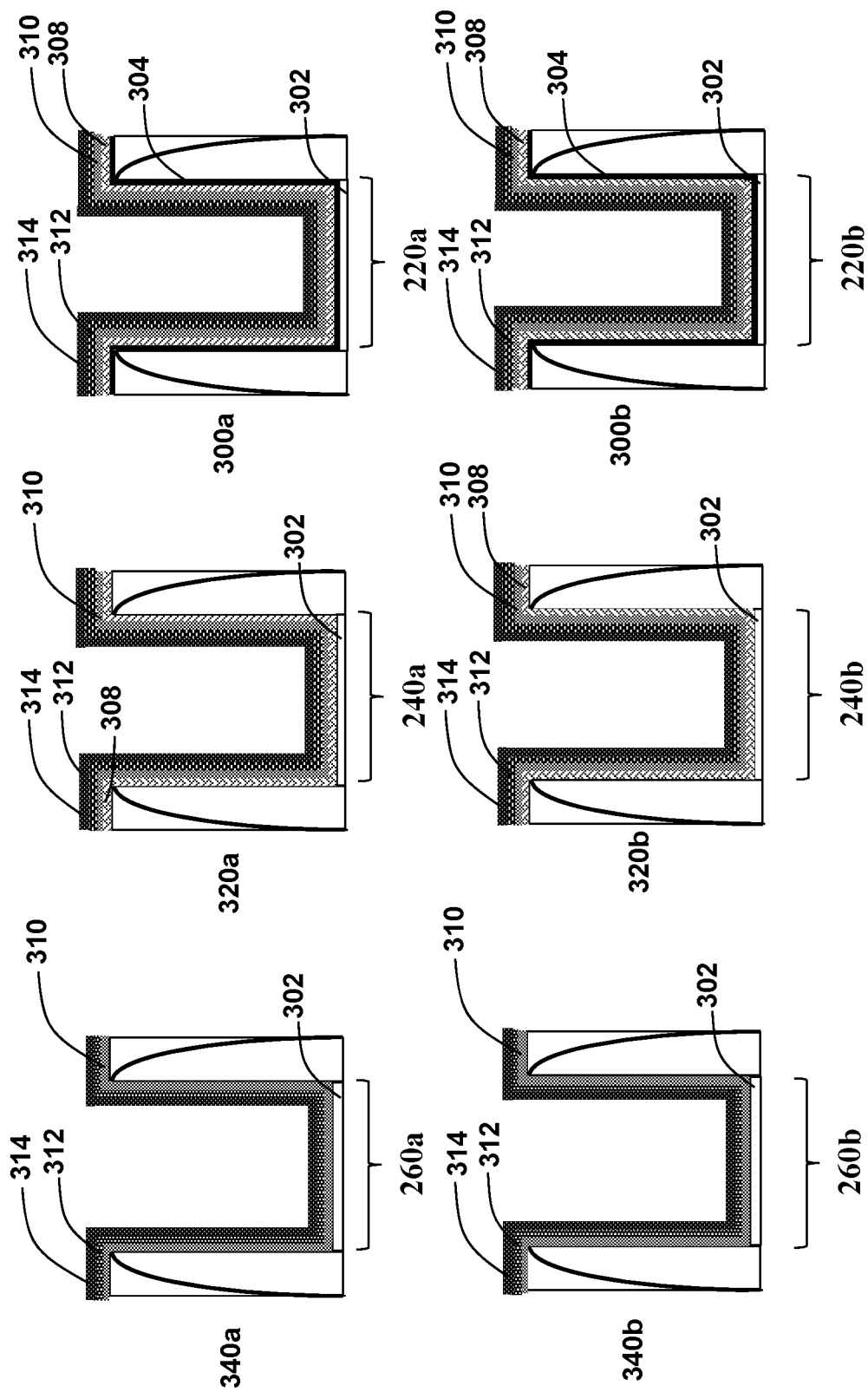

Referring to FIGS. 1A and 9, the method 100 includes a block 112 where a capping layer 312 is formed over the plurality of channel regions, including the first n-type channel region 220a, the second n-type channel region 240a, the third n-type channel region 260a, the first p-type channel region 220b, the second p-type channel region 240b, and the third p-type channel region 260b. In some embodiments, the first/second/third high-k dielectric layers 304, 308 and 310 may not be dense enough to prevent oxygen penetration into the interfacial layer 302, resulting in threshold voltage shift and deteriorated device performance. The capping layer 312, which is formed of a dielectric material that can stop oxygen from penetrating to the interfacial layer 302, may protect the interfacial layer 302 from further oxidation. In some implementations, the capping layer 312 may include titanium, nitrogen or silicon. In some examples, the capping layer 312 may be titanium silicide doped with nitrogen or titanium nitride. In some embodiments, the capping layer 312 is formed using ALD and has a thickness between about 10 Å and about 20 Å.

Referring to FIGS. 1B and 9, the method 100 includes a block 114 where a barrier layer 314 is formed over the plurality of channel regions, including the first n-type channel region 220a, the second n-type channel region 240a, the third n-type channel region 260a, the first p-type channel region 220b, the second p-type channel region 240b, and the third p-type channel region 260b. As will be described below, a p-type work function layer may be formed over the barrier layer 314 and the p-type work function layer may include aluminum as dopant. In some implementations, the barrier layer 314 may prevent aluminum from penetrating to the high-k dielectric layers and changing the work function properties of the high-k dielectric layers. In some embodiments, the barrier layer 314 may also serve as an etch stop layer for removal of the p-type work function layer. In some embodiments, the barrier layer 314 may be formed of a metal nitride, such as tantalum nitride, using ALD or other suitable method. In some instances, the barrier layer 314 may be formed to a thickness between about 5 Å and about 15 Å.

Figure 10:
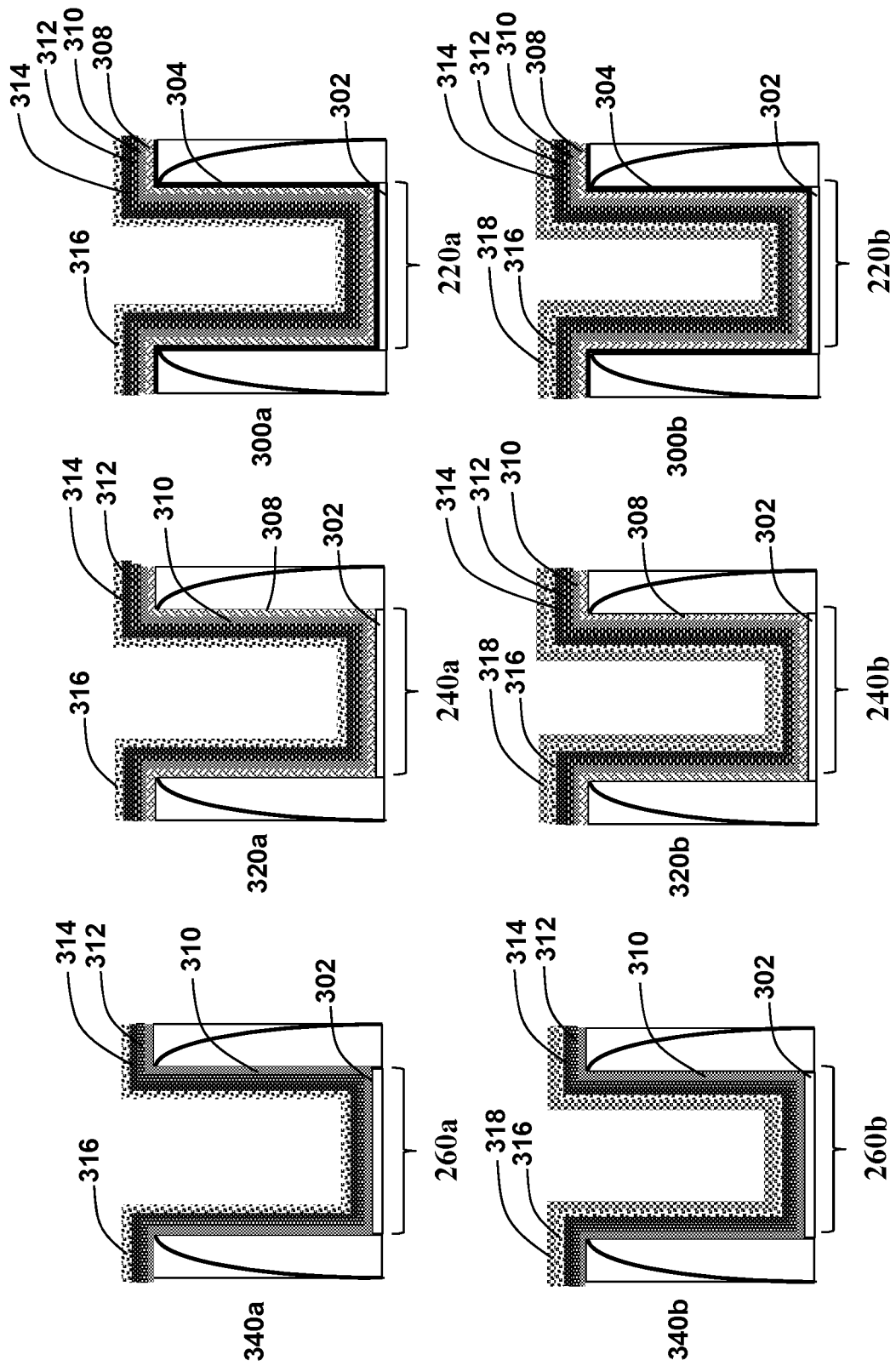
Figure 11:
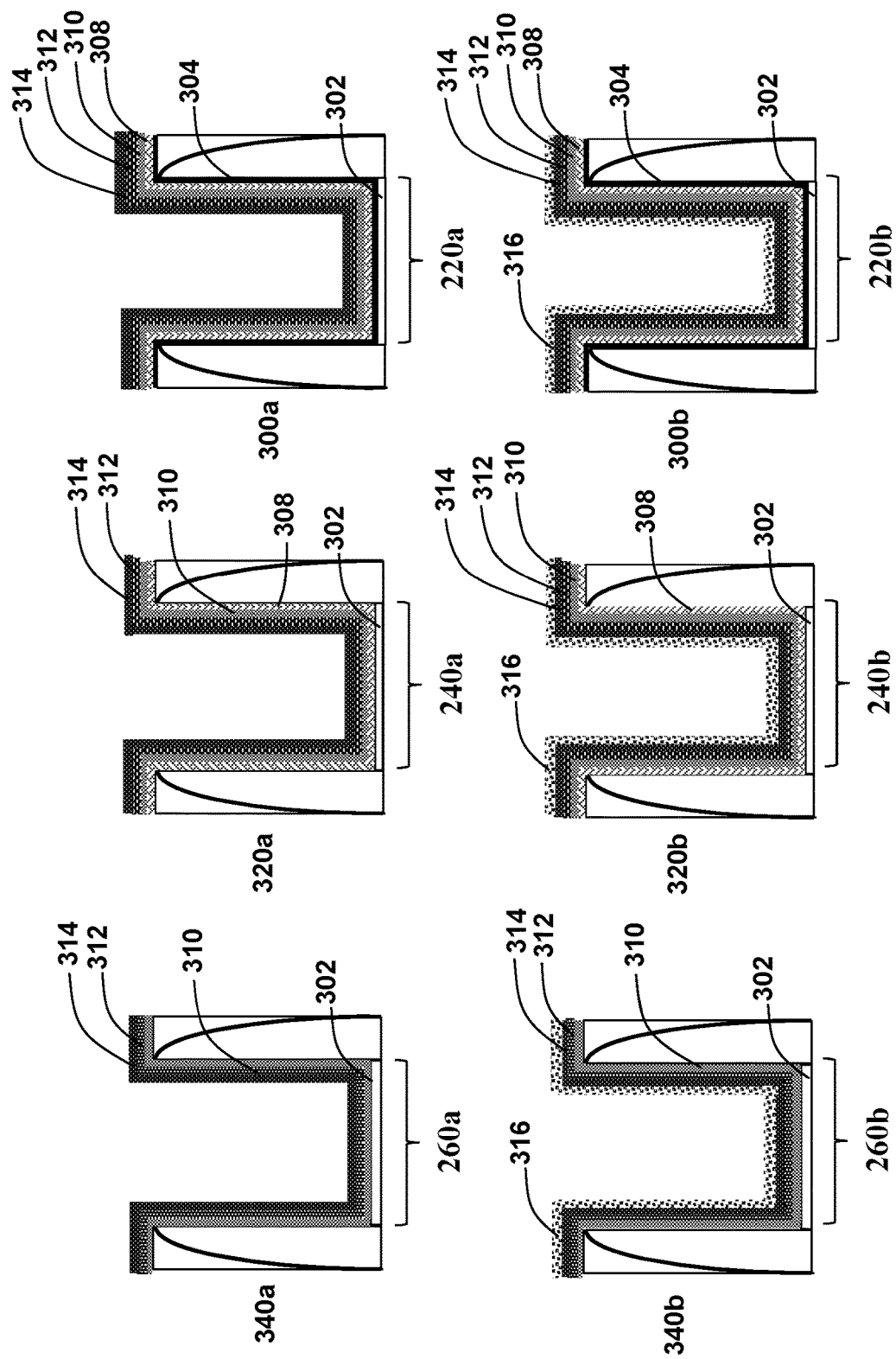

Referring to FIGS. 1B, 10 and 11, the method 100 includes a block 116 where a p-type work function layer 316 is selectively formed over the p-type channel regions, including the first p-type channel region 220b, the second p-type channel region 240b, and the third p-type channel region 260b. In some embodiments, the p-type work function layer 316 is globally deposited over the plurality of channel regions using ALD or other suitable method. Then a photoresist layer 318 is globally deposited over the workpiece 200, using chemical vapor deposition (CVD), ALD, or spin-on coating. As illustrated in FIG. 10, the photoresist layer 318 is then patterned using photolithography techniques such that the photoresist layer 318 only cover the p-type work function layer 316 deposited in first p-type channel region 220b, the second p-type channel region 240b, and the third p-type channel region 260b. For example, the photoresist layer 318 is exposed to radiation through or reflected off of a mask and the exposed photoresist layer 318 undergoes a chemical change in a post-exposure bake process, allowing the exposed or the unexposed portion of the photoresist layer 318 to be selectively removed by a developer solution. The photoresist layer 318 may be any suitable photoresist material and may include more than one layer. In some instances, the photoresist layer 318 may include a bottom layer, a middle layer and an upper layer. As shown in FIG. 11, the patterned photoresist layer 318 is then used as an etch mask to selectively remove the p-type work function layer 316 from the n-type channel regions, including the first n-type channel region 220a, the second n-type channel region 240a, and the third n-type channel region 260a. The selective removal of the p-type work function layer 316 may be accomplished by one or more etching processes, such as wet etching, dry etching, reactive ion etching, and/or atomic layer etching. In an embodiment, the etching process applies an etchant having a phosphoric acid. Additionally or alternatively, the etchant may include other components such as hydrogen peroxide ($H_2O_2$), Nitric acid ($HNO_3$), Sulfuric acid ($H_2SO_4$), deionized water (DIW), ammonium hydroxide ($NH_4OH$), ozone ($O_3$), hydrofluoric acid (HF), hydrochloric acid (HCl), other acidic solutions and organic oxidizer, or a combination thereof. In some embodiments, the p-type work function layer 316 includes a metal or metal nitride with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. In some embodiments, at block 116, the p-type work function layer 316 is formed to a thickness between about 20 Å and about 40 Å. The patterned photoresist layer 318 may then be removed by resist stripping, ashing, or other suitable process.

Figure 12:
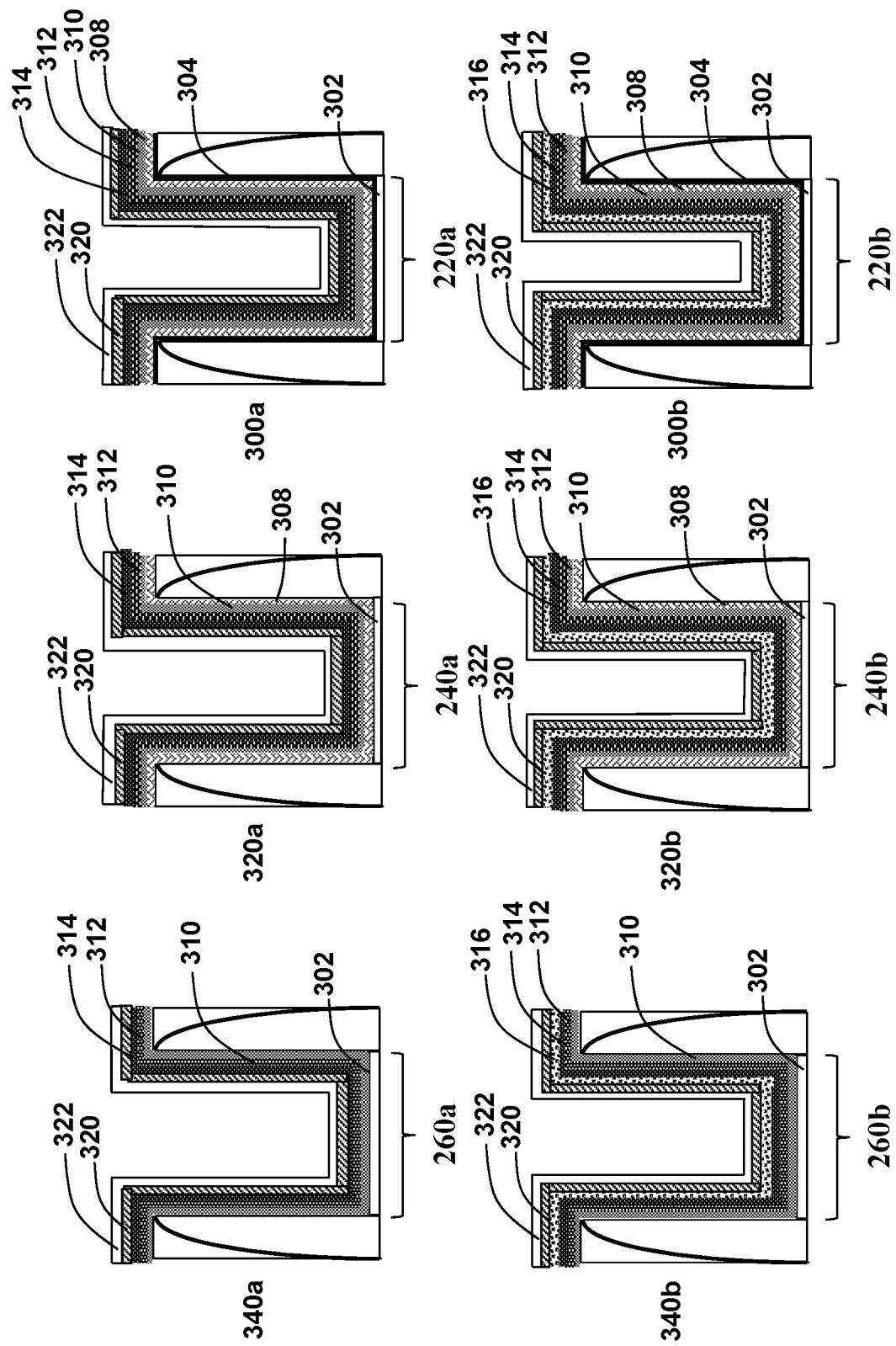

Referring now to FIGS. 1B and 12, the method 100 includes a block 118 where an n-type work function layer 320 is formed over the plurality of channel regions, including the first n-type channel region 220a, the second n-type channel region 240a, the third n-type channel region 260a, the first p-type channel region 220b, the second p-type channel region 240b, and the third p-type channel region 260b. In some embodiments, the n-type work function layer 320 is globally deposited over the plurality of channel regions using ALD or other suitable method. In some embodiments, the n-type work function layer 320 may include a metal, metal nitride, or metal carbide with sufficiently low effective work function, selected from but not restricted to the group of Ti, Al, Zr, Ta, Nb, TiAl, TaC, TaCN, TaSiN, TiSiN, TiAlC, TiAlN, or combinations thereof. In some implementations, the n-type work function layer 320 consists essentially of titanium carbide doped with aluminum (TiAlC). In some embodiments, at block 118, the n-type work function layer 320 is formed to a thickness between about 25 Å and about 40 Å.

Referring now to FIGS. 1B and 12, the method 100 includes a block 120 where a glue layer 322 is formed over the plurality of channel regions, including the first n-type channel region 220a, the second n-type channel region 240a, the third n-type channel region 260a, the first p-type channel region 220b, the second p-type channel region 240b, and the third p-type channel region 260b. The glue layer 322 may promote and/or enhance the adhesion between the gate metal fill layer and the n-type work function layer 320. In some embodiments, the glue layer 322 may be formed of a metal nitride, such as titanium nitride, using ALD. In some instances, the glue layer 322 may be formed to a thickness between about 10 Å and about 25 Å.

Figure 13:
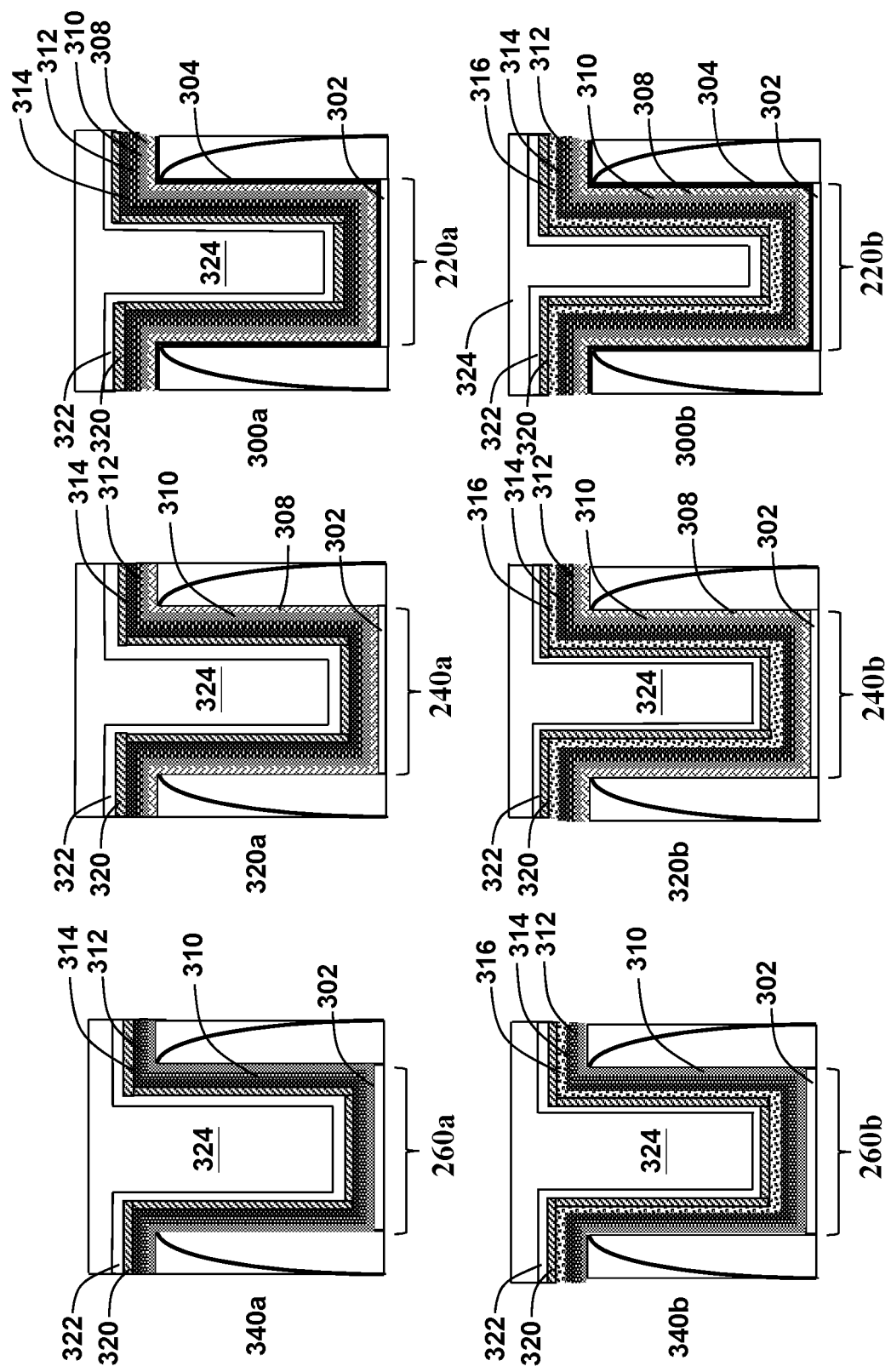

Referring now to FIGS. 1B and 13, the method 100 includes a block 122 where a gate metal fill layer 324 is formed over the workpiece 200. The gate metal fill layer 324 may include aluminum (Al), tungsten (W), cobalt (Co), copper (Cu), and/or other suitable materials and may be deposited using methods such as CVD, PVD, plating, and/or other suitable processes.

Figure 14:
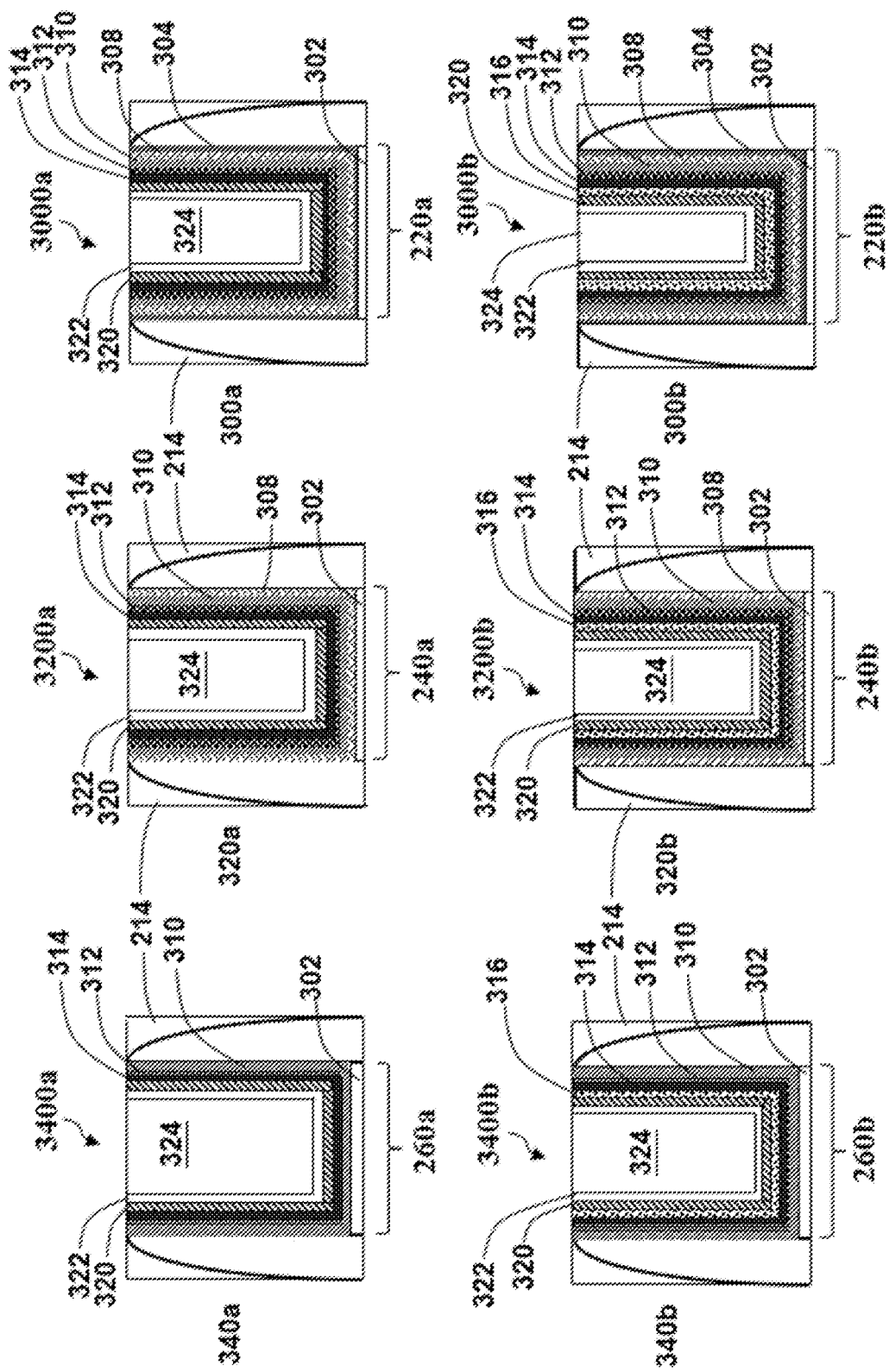

Referring now to FIGS. 1B and 14, the method 100 includes a block 124 where the workpiece 200 is planarized to remove excess material from the workpiece 200 such that a top surface of the ILD layer 214 is exposed. In some embodiments represented in FIG. 14, the block 124 of the method 100 may include performing a chemical mechanical planarization (CMP) process to remove excess first high-k dielectric layer 304, second high-k dielectric layer 308, third high-k dielectric layer 310, capping layer 312, barrier layer 314, p-type work function layer 316, n-type work function layer 320, glue layer 322, and the gate metal fill layer 324 outside the gate trenches (i.e. gate trenches 300a, 320a, 340a, 300b, 320b, and 340b) and deposited on the top surfaces of the ILD layer 214. Upon completion of block 124, a first high-k metal gate structure 3000a is formed over the first n-type channel region 220a, a second high-k metal gate structure 3200a is formed over the second n-type channel region 240a, a third high-k metal gate structure 3400a is formed over the third n-type channel region 260a, a fourth high-k metal gate structure 3000b is formed over the first p-type channel region 220b, a fifth high-k metal gate structure 3200b is formed over the second p-type channel region 240b, a sixth high-k metal gate structure 3400b is formed over the third p-type channel region 260b.

As shown in FIG. 14, the first high-k metal gate structure 3000a includes the first high-k dielectric layer 304, the second high-k dielectric layer 308, and the third high-k dielectric layer 310; the second high-k metal gate structure 3200a includes the second high-k dielectric layer 308 and the third high-k dielectric layer 310; the third high-k metal gate structure 3400a includes the third high-k dielectric layer 310; the fourth high-k metal gate structure 3000b includes the first high-k dielectric layer 304, the second high-k dielectric layer 308, and the third high-k dielectric layer 310; the fifth high-k metal gate structure 3200b includes the second high-k dielectric layer 308 and the third high-k dielectric layer 310; and the sixth high-k metal gate structure 3400b includes the third high-k dielectric layer 310.

Referring now to FIG. 1B, the method 100 further includes a block 126 where further processes are performed. For example, such further processes may include depositing another interlayer dielectric layer over the workpiece 200 in FIG. 14 and forming via contacts to the high-k metal gate structures 3000a, 3200a, 3400a, 3000b, 3200b, and 3400b and source/drain features. Such further processes may also include forming interconnect structures connecting the FinFETs to other portions of the semiconductor devices to be formed on the workpiece 200 to form a complete IC device.

It is noted that while three n-type channel regions and three p-type channel regions are illustrated in figures of the present disclosure, each of the channel regions represent a plurality of channel regions of the same type or property and a semiconductor device of the present disclosure includes more than six channel regions and high-k metal gate structures. In some embodiments, the first n-type channel region 220a represents a channel region of a first n-type device 2212a (FIG. 3) with a first threshold voltage (Vt1); the second n-type channel region 240a represents a channel region of a second n-type device 2214a with a second threshold voltage (Vt2); and the third n-type channel region 260a represents a channel region of a third n-type device 2216a with a third threshold voltage (Vt3). Similarly, the first p-type channel region 220b represents a channel region of a first p-type device 2212b (FIG. 3) with a fourth threshold voltage (Vt4); the second p-type channel region 240b represents a channel region of a second p-type device 2214b with a fifth threshold voltage (Vt5); and the third p-type channel region 260a represents a channel region of a third p-type device 2216b with a sixth threshold voltage (Vt6). In some implementations, with respect to the n-type devices, the first threshold voltage Vt1 is greater than the second threshold voltage Vt2 and the second threshold voltage Vt2 is greater than the third threshold voltage Vt3. With respect to the p-type devices, the sixth threshold voltage Vt6 is greater than the fifth threshold voltage Vt5 and the fifth threshold voltage Vt5 is greater than the fourth threshold voltage Vt4. In some instances, the first n-type device 2212a can be referred to as a standard threshold voltage n-type device (N-SVT); the second n-type device 2214a can be referred to as a low threshold voltage n-type device (N-LVT); and the third n-type device 2216a can be referred to as a ultra-low threshold voltage n-type device (N-uLVT). Similarly, the first p-type device 2212b can be referred to as a ultra-low threshold voltage p-type device (P-uLVT); the second p-type device 2214b can be referred to as a low threshold voltage p-type device (P-LVT); and the third p-type device 2216b can be referred to as a standard threshold voltage p-type device (P-SVT).

Although not intended to be limiting, one or more embodiments of the present disclosure provide many benefits to a semiconductor device and the formation thereof. For example, embodiments of the present disclosure provide novel high-k metal gate structures for n-type devices and p-type devices of multiple threshold voltages controlled by different stacks of high-k dielectric layers of different thicknesses and doping. The method and structure of the present disclosure allow the lithography patterning to be shifted at least partially to the high-k dielectric layer and reduce lithography patterning for forming different work function metal layer stacks for both n-type and p-type devices. As a result, the method and structure of the present disclosure may improve the metal gate fill process window and increase process robustness and yield. In addition, methods of the present disclosure can be readily integrated into existing semiconductor manufacturing processes.

In one exemplary aspect, the present disclosure is directed to a semiconductor device. The semiconductor device includes a semiconductor substrate, a plurality of fins disposed over the semiconductor substrate, and a plurality of gate structures. The plurality of fins includes a plurality of channel regions including first, second, and third p-type channel regions as well as first, second, and third n-type channel regions. The plurality of gate structure includes an interfacial layer (IL) disposed over the plurality of channel regions, a first high-k (HK) dielectric layer disposed over the first p-type channel region and the first n-type channel region, a second high-k dielectric layer disposed over the first n-type channel region, the second n-type channel region, the first p-type channel region, and the second p-type channel region, and a third high-k dielectric layer disposed over the plurality of channel regions. The first, second and third high-k dielectric layers are different from one another.

In some embodiments, the first high-k dielectric layer has a first thickness, the second high-k dielectric layer has a second thickness, and the third high-k dielectric layer has a third thickness. The third thickness is greater than the second thickness and the second thickness is greater than the first thickness. In some implementations, the first high-k dielectric layer includes aluminum and the third high-k dielectric layer includes lanthanum. In some embodiments, over the first p-type channel region and the first n-type channel region, the second high-k dielectric layer is disposed between the first high-k dielectric layer and the third high-k dielectric layer; and over the third n-type channel region and the third p-type channel region, the third high-k dielectric layer is in contact with the interfacial layer. In some instances, wherein the plurality of gate structures further includes a capping layer disposed over the third high-k dielectric layer over the plurality of channel regions, a barrier layer disposed over the capping layer over the plurality of channel regions, an n-type work function layer disposed over the capping layer over the plurality of channel regions, and over the first, second and third p-type channel regions, a p-type work function layer disposed between the n-type work function layer and the barrier layer. In some implementations, the capping layer includes titanium, silicon and nitrogen and the barrier layer includes tantalum and nitrogen. In some embodiments, the semiconductor device of the present disclosure further includes a glue layer directly on the n-type work function layer over the plurality of channel regions, and a fill metal material over the glue layer. In some instances, the first n-type channel region includes a first threshold voltage, the second n-type channel region includes a second threshold voltage, and the third n-type channel region includes a third threshold voltage. The first threshold voltage is greater than the second threshold voltage and the second threshold voltage is greater than the third threshold voltage. In some implementations, the first p-type channel region includes a fourth threshold voltage, the second p-type channel region includes a fifth threshold voltage, and the third p-type channel region includes a sixth threshold voltage. The sixth threshold voltage is greater than the fifth threshold voltage and the fifth threshold voltage is greater than the fourth threshold voltage.

In one exemplary aspect, the present disclosure is directed to a semiconductor device. The semiconductor device includes a semiconductor substrate, a plurality of fins disposed over the semiconductor substrate, and a plurality of gate structures. The plurality of fins includes a plurality of channel regions including first, second, and third p-type channel regions as well as first, second, and third n-type channel regions. The plurality of gate structures includes an interfacial layer (IL) disposed over the plurality of channel regions, a first high-k (HK) dielectric layer disposed on the interfacial layer over the first n-type channel region and the first p-type channel region, a second high-k dielectric layer disposed on the first high-k dielectric layer disposed over the first n-type channel region and the first p-type channel region, and on the interfacial layer disposed over the second n-type channel region and the second p-type channel region, and a third high-k dielectric layer disposed on the second high-k dielectric layer disposed over the first n-type channel region, the first p-type channel region, the second n-type channel region, the second p-type channel region, and on the interfacial layer disposed over the third n-type channel region and the third p-type channel region. The first, second and third high-k dielectric layers are different from one another.

In some embodiments, the first high-k dielectric layer has a first thickness, the second high-k dielectric layer has a second thickness, and the third high-k dielectric layer has a third thickness. The third thickness is greater than the second thickness and the second thickness is greater than the first thickness. In some embodiments, the first high-k dielectric layer includes aluminum and the third high-k dielectric layer includes lanthanum. In some implementations, the plurality of gate structures further includes a capping layer disposed over the third high-k dielectric layer over the plurality of channel regions, a barrier layer disposed over the capping layer over the plurality of channel regions, an n-type work function layer disposed over the capping layer over the plurality of channel regions, and over the first, second and third p-type channel regions, a p-type work function layer disposed between the n-type work function layer and the barrier layer. The capping layer includes titanium, silicon and nitrogen and the barrier layer includes tantalum and nitrogen. In some implementations, the first n-type channel region includes a first threshold voltage, the second n-type channel region includes a second threshold voltage, and the third n-type channel region includes a third threshold voltage. The first threshold voltage is greater than the second threshold voltage and the second threshold voltage is greater than the third threshold voltage. In some instances, the first p-type channel region includes a fourth threshold voltage, the second p-type channel region includes a fifth threshold voltage, and the third p-type channel region includes a sixth threshold voltage. The sixth threshold voltage is greater than the fifth threshold voltage and the fifth threshold voltage is greater than the fourth threshold voltage.

In another exemplary aspect, the present disclosure is directed to a method. The method includes providing a workpiece including a semiconductor substrate, a plurality of fins disposed over the semiconductor substrate, the plurality of fins comprising a plurality of channel regions including first, second, and third p-type channel regions as well as first, second, and third n-type channel regions, and forming a plurality of gate structures over the plurality of channel regions. Forming the plurality of gate structures over the plurality of channel regions includes forming an interfacial layer over the plurality of channel regions, selectively forming a first high-k dielectric layer over the interfacial layer over the first n-type channel region and the first p-type channel region, selectively forming a second high-k dielectric layer over the interfacial layer over the second n-type channel region and the second p-type channel region, and over the first high-k dielectric layer over the first n-type channel region and the first p-type channel region, forming a third high-k dielectric layer over the second high-k dielectric layer disposed over the first n-type channel region, the first p-type channel region, the second n-type channel region, the second p-type channel region, and over the interfacial layer disposed over the third n-type channel region and the third p-type channel region, selectively forming a p-type work function layer over the first, second and third p-type channel regions, forming an n-type work function layer over the plurality of channel regions, and forming a fill metal layer over the plurality of channel regions. The first, second and third high-k dielectric layers are different from one another.

In some embodiments, the selectively forming of the first high-k dielectric layer includes depositing the first high-k dielectric layer over the plurality of channel regions, depositing a metal nitride hard mask over the first high-k dielectric layer, patterning the metal nitride hard mask by removing the metal nitride hard mask over the second n-type channel region, the third n-type channel region, the third n-type channel region, the second p-type channel region, and the third p-type channel region, and recessing the deposited first high-k dielectric layer using the patterned metal nitride hard mask layer as an etch mask. In some implementations, the metal nitride hard mask includes titanium, tantalum, tungsten. In some instances, the method further includes depositing a capping layer over the third high-k dielectric layer over the plurality of channel regions, depositing a barrier layer over the capping layer over the plurality of channel regions, forming a p-type work function layer over the first, second and third p-type channel regions, and forming an n-type work function layer over the plurality of channel regions. The capping layer includes titanium, silicon and nitrogen and the barrier layer includes tantalum and nitrogen. In some embodiments, the selectively forming of the first high-k dielectric layer includes forming the first high-k dielectric layer to a first thickness. In these embodiments, the selectively forming of the second high-k dielectric layer includes forming the second high-k dielectric layer to a second thickness. In these embodiments, the selectively forming the third high-k dielectric layer includes forming the third high-k dielectric layer to a third thickness. Also, in these embodiments, the third thickness is greater than the second thickness and the second thickness is greater than the first thickness.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate;
a plurality of fins disposed over the semiconductor substrate, the plurality of fins comprising a plurality of channel regions including first, second, and third p-type channel regions as well as first, second, and third n-type channel regions; and
a plurality of gate structures comprising:
an interfacial layer (IL) disposed over the plurality of channel regions;

a first high-k (HK) dielectric layer disposed over the first p-type channel region and the first n-type channel region;
a second high-k dielectric layer disposed over the first n-type channel region, the second n-type channel region, the first p-type channel region, and the second p-type channel region; and
a third high-k dielectric layer disposed over the plurality of channel regions, wherein the first, second and third high-k dielectric layers are different from one another.

2. The semiconductor device of claim 1,
wherein the first high-k dielectric layer has a first thickness, the second high-k dielectric layer has a second thickness, and the third high-k dielectric layer has a third thickness,
wherein the third thickness is greater than the second thickness and the second thickness is greater than the first thickness.

3. The semiconductor device of claim 1,
wherein the first high-k dielectric layer comprises aluminum,
wherein the third high-k dielectric layer comprises lanthanum.

4. The semiconductor device of claim 1,
wherein, over the first p-type channel region and the first n-type channel region, the second high-k dielectric layer is disposed between the first high-k dielectric layer and the third high-k dielectric layer,
wherein, over the third n-type channel region and the third p-type channel region, the third high-k dielectric layer is in contact with the interfacial layer.

5. The semiconductor device of claim 1, wherein the plurality of gate structures further comprises:
a capping layer disposed over the third high-k dielectric layer over the plurality of channel regions;
a barrier layer disposed over the capping layer over the plurality of channel regions;
an n-type work function layer disposed over the capping layer over the plurality of channel regions; and
over the first, second and third p-type channel regions, a p-type work function layer disposed between the n-type work function layer and the barrier layer.

6. The semiconductor device of claim 5,
wherein the capping layer comprises titanium, silicon and nitrogen,
wherein the barrier layer comprises tantalum and nitrogen.

7. The semiconductor device of claim 5, further comprising:
a glue layer directly on the n-type work function layer over the plurality of channel regions; and
a fill metal material over the glue layer.

8. The semiconductor device of claim 1,
wherein the first n-type channel region comprises a first threshold voltage, the second n-type channel region comprises a second threshold voltage, and the third n-type channel region comprises a third threshold voltage,
wherein the first threshold voltage is greater than the second threshold voltage and the second threshold voltage is greater than the third threshold voltage.

9. The semiconductor device of claim 1,
wherein the first p-type channel region comprises a fourth threshold voltage, the second p-type channel region comprises a fifth threshold voltage, and the third p-type channel region comprises a sixth threshold voltage,
wherein the sixth threshold voltage is greater than the fifth threshold voltage and the fifth threshold voltage is greater than the fourth threshold voltage.

10. A semiconductor device, comprising:
a semiconductor substrate;
a plurality of fins disposed over the semiconductor substrate, the plurality of fins comprising a plurality of channel regions including first, second, and third p-type channel regions as well as first, second, and third n-type channel regions; and
a plurality of gate structures comprising:
an interfacial layer (IL) disposed over the plurality of channel regions;
a first high-k (HK) dielectric layer disposed on the interfacial layer over the first n-type channel region and the first p-type channel region;
a second high-k dielectric layer disposed on the first high-k dielectric layer disposed over the first n-type channel region and the first p-type channel region, and on the interfacial layer disposed over the second n-type channel region and the second p-type channel region; and
a third high-k dielectric layer disposed on the second high-k dielectric layer disposed over the first n-type channel region, the first p-type channel region, the second n-type channel region, the second p-type channel region, and on the interfacial layer disposed over the third n-type channel region and the third p-type channel region,
wherein the first, second and third high-k dielectric layers are different from one another.

11. The semiconductor device of claim 10,
wherein the first high-k dielectric layer has a first thickness, the second high-k dielectric layer has a second thickness, and the third high-k dielectric layer has a third thickness,
wherein the third thickness is greater than the second thickness and the second thickness is greater than the first thickness.

12. The semiconductor device of claim 10,
wherein the first high-k dielectric layer comprises aluminum,
wherein the third high-k dielectric layer comprises lanthanum.

13. The semiconductor device of claim 10, wherein the plurality of gate structures further comprises:
a capping layer disposed over the third high-k dielectric layer over the plurality of channel regions;
a barrier layer disposed over the capping layer over the plurality of channel regions;
an n-type work function layer disposed over the capping layer over the plurality of channel regions; and
over the first, second and third p-type channel regions, a p-type work function layer disposed between the n-type work function layer and the barrier layer,
wherein the capping layer comprises titanium, silicon and nitrogen,
wherein the barrier layer comprises tantalum and nitrogen.

14. The semiconductor device of claim 10,
wherein the first n-type channel region comprises a first threshold voltage, the second n-type channel region comprises a second threshold voltage, and the third n-type channel region comprises a third threshold voltage, wherein the first threshold voltage is greater than the second threshold voltage and the second threshold voltage is greater than the third threshold voltage.

15. The semiconductor device of claim 10, wherein the first p-type channel region comprises a fourth threshold voltage, the second p-type channel region comprises a fifth threshold voltage, and the third p-type channel region comprises a sixth threshold voltage,
wherein the sixth threshold voltage is greater than the fifth threshold voltage and the fifth threshold voltage is greater than the fourth threshold voltage.

16. A semiconductor device, comprising:
a first gate structure over a first fin, the first gate structure comprising:
an interfacial layer over a channel region of the first fin,
a first high-k dielectric layer on the interfacial layer,
a second high-k dielectric layer on the first high-k dielectric layer,
a third high-k dielectric layer on the second high-k dielectric layer, and
a capping layer on the third high-k dielectric layer;
a second gate structure over a second fin, the second gate structure comprising:
the interfacial layer over a channel region of the second fin,
the second high-k dielectric layer on the interfacial layer,
the third high-k dielectric layer on the second high-k dielectric layer, and
a capping layer on the third high-k dielectric layer; and
a third gate structure over a third fin, the third gate structure comprising:
the interfacial layer over a channel region of the third fin,
the third high-k dielectric layer on the interfacial layer, and
a capping layer on the third high-k dielectric layer,
wherein the first high-k dielectric layer is doped with aluminum,
wherein the third high-k dielectric layer is doped with lanthanum.

17. The semiconductor device of claim 16, wherein the first high-k dielectric layer, the second high-k dielectric layer, and the third high-k dielectric layer comprise hafnium oxide.

18. The semiconductor device of claim 16, wherein the first high-k dielectric layer has a first thickness, the second high-k dielectric layer has a second thickness, and the third high-k dielectric layer has a third thickness,
wherein the third thickness is greater than the second thickness and the second thickness is greater than the first thickness.

19. The semiconductor device of claim 16, wherein each of the first gate structure, the second gate structure, and the third gate structure further comprises:
a barrier layer over the capping layer,
an n-type work function layer over the barrier layer,
a glue layer over the n-type work function layer, and
a gate metal fill layer over the glue layer,
wherein the capping layer comprises titanium silicide doped with nitrogen or titanium silicide and the barrier layer comprises tantalum nitride.

20. The semiconductor device of claim 19, wherein each of the first gate structure, the second gate structure, and the third gate structure further comprises a p-type work function layer disposed between the n-type work function layer and the barrier layer.

* * * * *